United States Patent
Ogatsu et al.

(10) Patent No.: US 8,462,513 B2
(45) Date of Patent: *Jun. 11, 2013

(54) PORTABLE APPARATUS

(75) Inventors: Toshinobu Ogatsu, Tokyo (JP); Toshiki Yamanaka, Shizuoka (JP)

(73) Assignee: NEC Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/973,654

(22) Filed: Dec. 20, 2010

(65) Prior Publication Data

US 2011/0084886 A1    Apr. 14, 2011

Related U.S. Application Data

(63) Continuation of application No. 12/438,686, filed as application No. PCT/JP2006/317141 on Aug. 30, 2006, now Pat. No. 7,889,507.

(51) Int. Cl.
*H05K 5/00* (2006.01)

(52) U.S. Cl.
USPC .................. 361/752; 361/801; 361/803

(58) Field of Classification Search
USPC .......... 361/728, 730, 752, 786, 800–803, 361/679, 790, 796; 455/91, 128; 434/702, 434/711, 715, 763, 766, 841, 850, 860, 878, 434/880, 888

See application file for complete search history.

(56) References Cited

U.S. PATENT DOCUMENTS

| | | | |
|---|---|---|---|
| 5,327,322 A | 7/1994 | Ma | |
| 5,331,136 A * | 7/1994 | Koenck et al. | 235/375 |
| 5,475,566 A * | 12/1995 | Rada et al. | 361/736 |
| 5,513,074 A | 4/1996 | Ainsbury et al. | |
| 5,786,789 A | 7/1998 | Janky | |
| 5,995,854 A | 11/1999 | Wilson | |
| 5,999,294 A * | 12/1999 | Petsko | 398/115 |
| 6,018,461 A * | 1/2000 | Biermann et al. | 361/737 |
| 7,382,625 B2 * | 6/2008 | Thornton et al. | 361/737 |
| 7,428,431 B2 | 9/2008 | Timms | |
| 7,577,468 B2 * | 8/2009 | Begic et al. | 455/575.8 |
| 7,746,635 B2 | 6/2010 | Lu | |
| 2004/0114754 A1 | 6/2004 | Nuovo | |

(Continued)

FOREIGN PATENT DOCUMENTS

| | | |
|---|---|---|
| EP | 0 177 362 A2 | 10/1984 |
| EP | 1 473 909 A1 | 11/2004 |

(Continued)

OTHER PUBLICATIONS

Extended European Search Report issued in European Application No. 11175443.8 dated Jan. 24, 2012.

*Primary Examiner* — Hung S Bui
(74) *Attorney, Agent, or Firm* — Sughrue Mion, PLLC

(57) ABSTRACT

First and second housings of a metal sheet are superposed over each other and fixed to each other by bolts to form an element receiving space. An antenna is fixed to the second housing by a bolt so as to be adjacent to the first housing. A hook section is fixed to the first housing. The hook section is inserted in a hole of the antenna, a step-shaped forward lower step section of the hook section is engaged with the peripheral edge of the hole in the antenna, and thus the first housing and the antenna are fixed to each other. The antenna is embedded in resin and covered by the resin.

7 Claims, 4 Drawing Sheets

U.S. PATENT DOCUMENTS

| | | |
|---|---|---|
| 2004/0185701 A1 | 9/2004 | Yoshie |
| 2004/0240190 A1 | 12/2004 | Hsu et al. |
| 2004/0252466 A1* | 12/2004 | Bor-Ren ................. 361/737 |

FOREIGN PATENT DOCUMENTS

| | | |
|---|---|---|
| JP | 60-174282 U | 11/1985 |
| JP | 61-35457 U | 3/1986 |
| JP | 63-120500 A | 5/1988 |
| JP | 2002-536916 A | 10/2002 |
| JP | 2003-304109 A | 10/2003 |
| JP | 2004-288402 A | 10/2004 |
| JP | 2004-317588 A | 11/2004 |

* cited by examiner

PORTABLE APPARATUS

This is a continuation of application Ser. No. 12/438,686 filed Feb. 24, 2009, claiming priority based on International Application No. PCT/JP2006/317141 filed Aug. 30, 2006, the contents of all of which are incorporated herein by reference in their entirety.

TECHNICAL FIELD

The present invention relates to a portable apparatus, such as a cellular phone or a compact TV or radio, having a sheet metal housing and an antenna as its external surface.

BACKGROUND ART

In recent years, portable terminal devices have been becoming more compact and thinner. Thin and highly rigid metal sheets, which are sheets made of stainless alloy, etc. and formed by press forming or the like, are used as part of housings of portable terminal devices. Antenna elements must be located away from surrounding metal components by a certain distance so as not to affect the performance of the antenna. A problem in reducing the size of portable terminal devices is that the mounting location of the antenna is limited and that a fitting part of housings made of sheet metals cannot be extended very close to the antenna. To address the needs to reduce the size and thickness of terminal devices without compromising the wireless performance of an antenna, the antenna is often mounted on an external surface of the housing to maintain the distance of the antenna elements from surrounding metal components.

When a housing made of sheet metals is adjacent to the antenna mounted on an external surface of the housing, as described above, a fitting hook and the like cannot protrude from the housing in order to maintain the distance between the antenna elements and surrounding metal components. In this setting, without a fitting part between the antenna and the sheet-metal housing, they are eventually deformed by an external force, and protrusion of an edge part of the housing can occur.

Extension and connection of a resin part of the antenna to the metal housing require a space for installing connecting parts, which is problematic in reducing the size of terminal devices.

Patent Literature 1: Unexamined Japanese Patent Application KOKAI Publication No. 2004-317588

DISCLOSURE OF THE INVENTION

Problem to be Solved by the Invention

The present invention has been made in view of the aforementioned problems. Specifically, the present invention relates to a portable apparatus comprising a housing produced by press forming or the like and a resin part being adjacent to the housing and having at least an external surface coated with resin, wherein protrusion of the housing, which is made of sheet metals or the like, is unlikely to occur even under influence of an external force; when the resin part is an antenna, the performance of the antenna is not affected; and mounting is possible in a limited space.

Means for Solving the Problem

A portable apparatus according to the present invention comprises: a first housing made of metal sheets; a second housing made of metal sheets, the second housing being mounted with and fixed to the first housing, whereby an inside device storage space is provided therebetween; and a resin part having at least its external surface coated with resin, the resin part being fixed to the second housing at an adjacent position to the first housing, wherein:

the first housing has multi-level hook parts at a side edge thereof facing the resin part, and front parts of the hook parts are positioned below the rear parts thereof;

the resin part has hole parts, into which the hook parts are to be provided at a side edge thereof facing the first housing; and with the hook parts being inserted into the hole parts, the front parts of the hook parts are locked at peripheral edges of the hole parts.

The resin part is, e.g., an antenna coated with resin. According to the present invention, the first and second housings, both of which are made of metal sheets, are fixed to each other using screws or the like. The resin part, such as an antenna, and the second housing are also fixed to each other using screws or the like. The hook parts are either fixed to the first housing by welding or formed integrally therewith. The hook parts are inserted into the hole parts of the antenna, and the lower front parts of the multi-level hooks are locked at peripheral edges of the hole parts, whereby the first housing and the resin part, such as an antenna, are fixed to each other. When an external force is exerted on the portable apparatus and stress acts in a direction in which the antenna and the first housing are separated, the first housing does not protrude because the hook parts are locked to the hole parts. When the resin part is an antenna, the antenna performance is not compromised, and the mounting space can be small. Resin parts other than antennas include an integrally formed resin cover. By forming a part of a housing as a resin cover to cover heat-prone parts of the housing with the resin cover, the effects of heat on surrounding areas can be restrained. Resin materials that can be used include engineering plastic such as polycarbonate, ABS resin, etc.; fiber-reinforce plastic reinforced the engineering plastic by carbon or glass fiber; and inorganic ceramic.

According to the present invention, the hook parts, which are members made of metal sheets, are preferably formed separately from the first housing and connected thereto by welding or formed integrally with the first housing.

Also, with the hook parts being inserted into the hole parts and locked thereto, the surface of the antenna is preferably higher than that of the first housing.

Effect of the Invention

According to the present invention, when an external force is exerted on a portable apparatus and stress acts in a direction in which the resin part, such as an antenna, and the first housing are separated, the first housing does not protrude because the hook parts are locked to the hole parts. When the resin part is an antenna, the performance thereof is not compromised by this mechanism. Also, no obstacles to size reduction of terminal devices can be found since the mounting space can be small.

EXPLANATION OF REFERENCE NUMERALS

Figure 1:
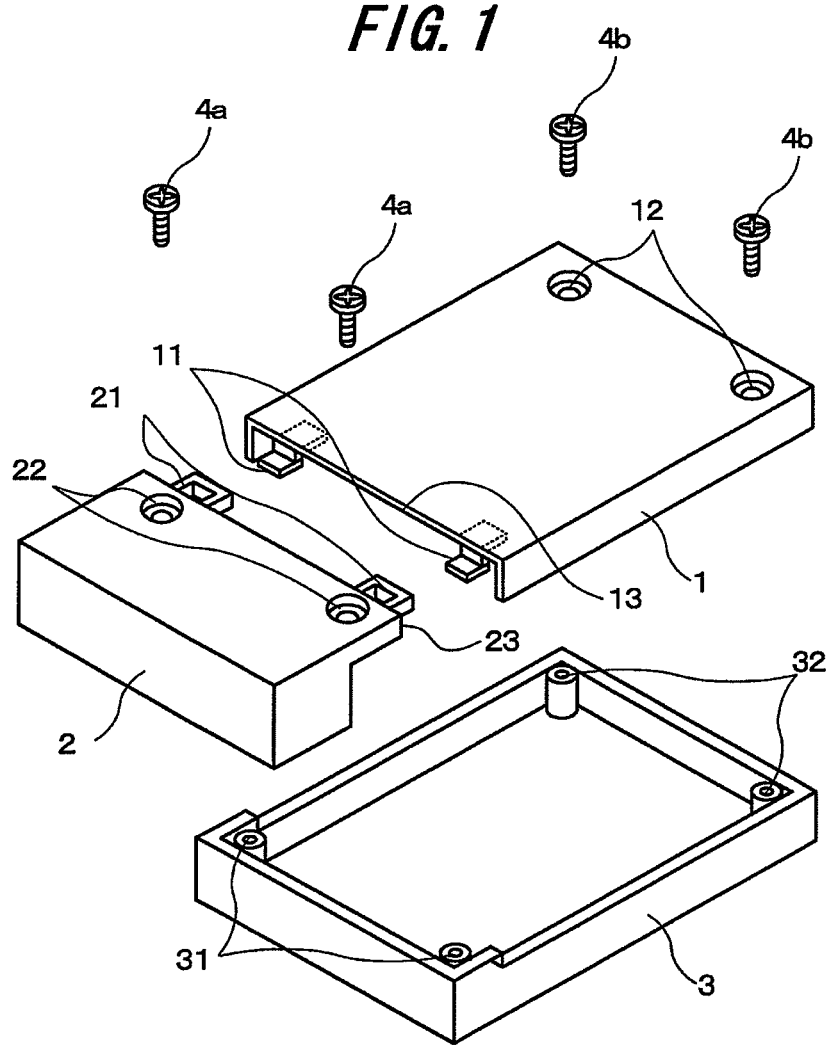
FIG. 1 is a perspective diagram illustrating a method of assembling a portable apparatus according to a first embodiment of the present invention.

1: first housing
2: antenna
3: second housing
4a, 4b: bolt
11: hook part
12: hole
13: edge part
21: hole part
22: hole
23: edge part
29: boundary
31, 32: boss

BEST MODE FOR CARRYING OUT THE INVENTION

Figure 2:
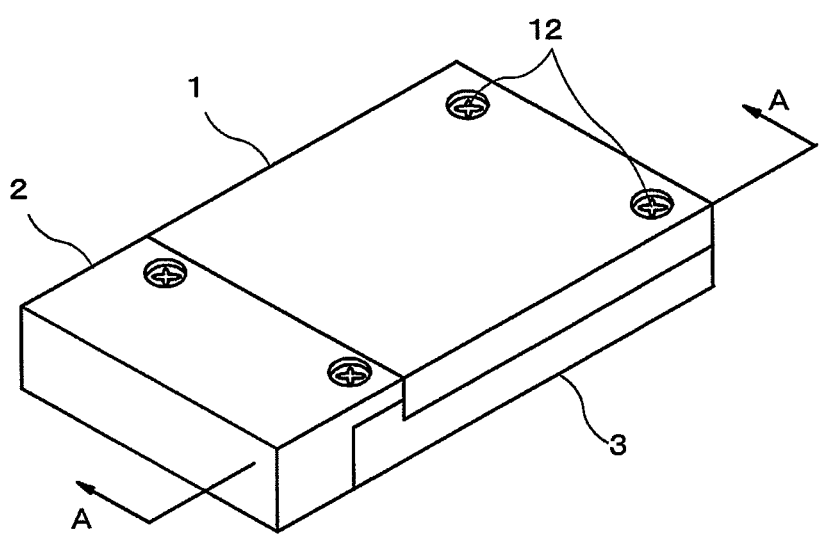
FIG. 2 is another perspective diagram illustrating a portable apparatus according the first embodiment of the present invention.
Figure 3A:
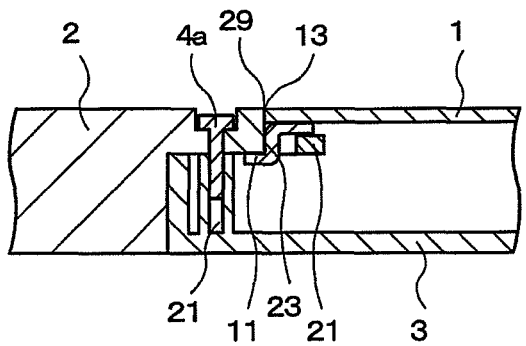
FIG. 3A and FIG. 3B are cross-sectional diagrams illustrating the mechanism of the first embodiment of the present invention.
Figure 3B:
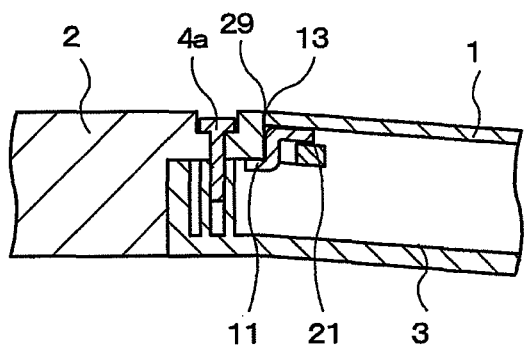

The embodiments of the present invention are explained in detail below by referring to the attached drawings. FIG. 1 is a perspective diagram illustrating assembly of a portable apparatus according to the first embodiment of the present invention. FIG. 2 is a perspective diagram illustrating the apparatus upon assembly. FIG. 3A and FIG. 3B are cross-sectional diagram illustrating mechanisms of the portable apparatus along the A-A line in FIG. 2.

A first housing 1 and a second housing 3 are made of metal sheets formed by performing plastic working, such as press forming or the like, and are formed in a box form. The side walls on the edge of the second housing 3 have a section which is slightly higher than the rest. On the lower section of the side walls of the second housing 3, the side walls of the first housing 1 are mounted, such that the device is stored in the space surrounded therebetween. An antenna 2 is located adjacent to the first housing 1 and mounted on the slightly higher section of the side walls of the second housing 3. The external surface of the antenna 2 is coated with resin, which serves as an insulation layer. Even if the antenna 2 contacts the first housing 1 and the second housing 3, both of which are made of metal sheets, the performance thereof does not deteriorate. The antenna 2 is embedded in resin so that it is coated therewith.

At the four corners of the second housing 3, bosses 31 and 32, each having a screw hole with which either a bolt 4a or 4b is engaged, are provided. On the side edge of the first housing 1 far away from the antenna 2, holes 12, through which bolts 4b are to be inserted, are formed. By inserting the bolts 4b into the holes 12 and engaging the bolts 4b with the screw holes of the bosses 32, the first housing 1 is fixed to the second housing 3. On the side edge of the antenna 2 facing the first housing 1, holes 22 are provided, through which the bolts 4a are to be inserted. By inserting the bolts 4a into the holes 22 and engaging the bolts 4a with the screw holes of the bosses 31, the antenna 2 is fixed to the second housing 3.

On a side edge 13 of the first housing 1 facing the antenna 2, two hook parts 11 are provided. The cross-section of the hook parts 11 is crank- or key-shaped, and the hook parts 11 have a multi-level configuration where the rear parts are positioned above than the front parts. The hook parts 11 are formed by performing press forming of metal plates, as in the case of the first housing 1. The upper level of the rear parts are fixed to the internal surface of the first housing 1 by spot welding or the like. On a side edge 29 of the antenna 2 facing the first housing 1, hole parts 21, which has a horseshoe shape in a plane view, are provided such that they protrude from the side surface of the antenna 2. The hole parts 21 thereby form a rectangular surrounded by four sides, including the side edge 23 of the antenna 2

The antenna 2 thus structured, the first housing 1, and the second housing 3 are assembled as follows. First, the antenna 2 is mounted on the second housing 3, and the bolts 4a are inserted through the holes 22 and engaged with the screw holes of the bosses 31 of the second housing 3. The hook parts 11 of the first housing 1 are inserted into the hole parts 21, and the lower front parts of the hook parts 11 are locked on the lower surfaces of peripheral edges of the hole parts 21. In this condition, the upper surface of the antenna 2 and the upper surface of the first housing 1 form substantially one surface, and the bolts 4b are inserted through the holes 12 and engaged with the screw holes of the bosses 32 of the second housing 3. Then the first housing 1 and the antenna 2 are fixed to the second housing 3, and the first housing 1 and the antenna 2 are locked and fixed to each other.

As illustrated in FIG. 3A, when all the members are assembled, the upper surface of the antenna 2 and the upper surface of the first housing form substantially one surface. As illustrated in FIG. 3B, when an external force acts on the portable apparatus, the forces acting between the antenna 2 and the first housing 1, and between the antenna 2 and the second housing 3 include stress exerted on the boundary 29 between the first housing 1 and the antenna 2 in a direction in which separation therebetween eventually occurs. There is a force to push upward the side edge 13 of the first housing 1 facing the antenna 2, but such upward movement does not take place because the lower front parts of the hook parts 11, which are fixed to the first housing 1, are locked on the lower surface of the hole parts 21 of the antenna 2. Therefore, protrusion of the first housing 1 does not occur. Even with presence of an external force, protrusion of the corner of the side edge 13 of the first housing 1 is restrained. In this embodiment, these connection parts do not cause an increase in the size of portable apparatuses or deterioration of the antenna performance.

The present invention provides a connection structure whereby side surfaces of sheet-metal housings fitting with each other are not easily separated by an external force. Also, implementation of this structure is possible in a limited mounting space without compromising the antenna performance.

Figure 4:
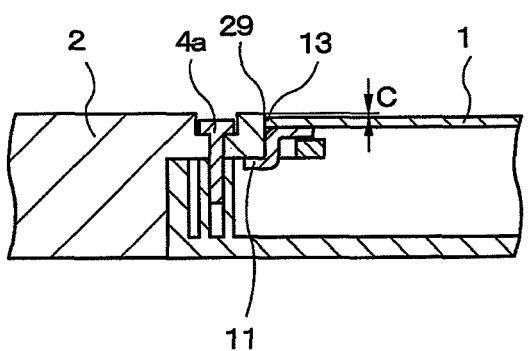
FIG. 4 is a cross-sectional diagram illustrating a portable apparatus according to a second embodiment of the present invention.

Next, the second embodiment of the present invention is explained. As illustrated FIG. 4, according to this embodiment, when the first housing 1, the antenna 2, and the second housing 3 are assembled, a slight level difference C exists between the upper surfaces of the antenna 2 and the first housing 1.

This embodiment produces effects similar to those of the first embodiment. However, according to this embodiment, the upper surface of the first housing 1 is lower than that of the antenna 2 by the level difference C. When an external force acts, protrusion of the side edge of the first housing 1, which faces the antenna 2, to above the upper surface of the antenna 2 at the boundary 29 can be more effectively prevented.

Figure 5:
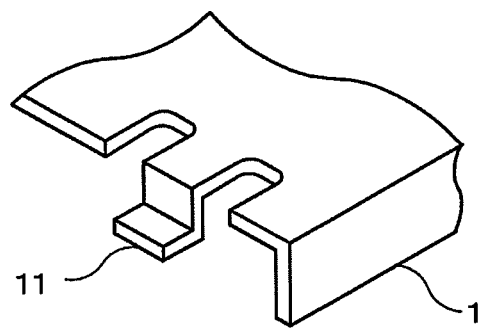
FIG. 5 is a perspective diagram illustrating a part of a portable apparatus according to a third embodiment of the present invention.

Next, the third embodiment of the present invention is explained by referring to FIG. 5. In this embodiment, the hook parts 11 of the first housing 1 are not formed separately from the first housing 1. When a part of the first housing 1 is produced by sheet metal processing, e.g., by performing sheet metal punching and plastic working, such as press forming or the like, the level difference at an edge of a metal plate identical to that of the first housing 1, as illustrated in FIG. 5, is created for integrally forming the first housing 1 and the hook parts 11. The integral formation of the first housing 1 and the hook parts 11 contributes to reducing processing time as well as processing costs.

In the foregoing embodiments, the resin part is an antenna coated with resin, but the resin part according to the present invention is not limited to a resin-coated antenna. It may be, for example, a resin cover into which resin is integrated. The effects of heat on surrounding areas are smaller when heat-prone parts of a housing are provided in a resin cover than when they are provided in any given part of the first and second housings, both of which are made of metal sheets. Materials that can be used include inorganic ceramic.

INDUSTRIAL APPLICABILITY

The present application is ideally applicable to portable apparatuses having a resin part, such as antenna, on an external surface thereof. Such apparatuses include cellular phones and compact TVs and radios.

The invention claimed is:

1. A portable apparatus comprising:
a first housing made of a metal sheet,
a second housing being mounted with and fixed to the first housing, whereby an inside device storage space is provided therebetween; and
a resin part having at least an external surface coated with resin and being fixed to the second housing at a position adjacent to the first housing,
wherein the resin part has an antenna, and
a difference in level exists so that the external surface of the resin part is situated more inside than an external surface of the first housing.

2. The portable apparatus according to claim 1, wherein the external surface of the first housing and the external surface of the resin part constitute an external surface of the portable apparatus.

3. The portable apparatus according to claim 1, wherein the first housing and the resin part are fixed to the second housing, and the resin part is fixed to the first housing.

4. The portable apparatus according to claim 1, wherein the second housing comprises a metal sheet.

5. The portable apparatus according to claim 1, wherein the antenna is coated with resin.

6. A portable apparatus comprising:
a first housing made of a metal sheet;
a second housing being mounted with and fixed to the first housing whereby an inside device storage space is provided therebetween; and
a resin part having at least an external surface coated with resin and being fixed to the second housing at a position adjacent to the first housing,
wherein the resin part has an antenna,
a first protrusion provided at a resin-part-side edge part of the first housing is situated between a first-housing-side edge part of the resin part and the second housing, wherein the resin-part-side edge part is situated closely to the resin part in the first housing, and the first-housing-side edge part is situated closely to the first housing in the resin part, and
a second protrusion provided at the resin-part-side edge part of the resin part is situated between a resin-part-side edge part of the first housing and the second housing.

7. The portable apparatus according to claim 6, wherein the second protrusion has a hole part into which the first protrusion is inserted.

* * * * *